United States Patent [19]

Sorel et al.

[11] Patent Number: 4,764,122

[45] Date of Patent: Aug. 16, 1988

[54] DATA BUS CONNECTOR

[75] Inventors: Alain Sorel, Evreux; Francis Vernet, Paris, both of France

[73] Assignee: U.S. Philips Corporation, New York, N.Y.

[21] Appl. No.: 13,318

[22] Filed: Feb. 11, 1987

[30] Foreign Application Priority Data

Feb. 14, 1986 [FR] France ................................ 86 02027

[51] Int. Cl.⁴ ............................................. H01R 9/09
[52] U.S. Cl. ....................................... 439/66; 439/74; 439/79
[58] Field of Search .......... 339/17 LM, 17 M, 17 LC; 361/393–396, 412, 413, 415; 439/66, 74, 75, 76, 79

[56] References Cited

U.S. PATENT DOCUMENTS 2,913,634 11/1959 Scoville ............................ 339/17 M

FOREIGN PATENT DOCUMENTS 273833 2/1963 Australia ............................ 361/412
0123457 3/1984 European Pat. Off. .
1076766 3/1960 Fed. Rep. of Germany ... 339/17 M Primary Examiner—Neil Abrams
Attorney, Agent, or Firm—Robert T. Mayer

[57] ABSTRACT

The invention relates to a data bus connector or a connector for another complex high-speed electronic application. In accordance with the invention, the connector comprises a plurality of substrates (4, 5, 6) which are arranged at a plurality of mutually substantially parallel levels. Active circuits (10) are mounted on the substrates (4, 5, 6) and are connected between input pins (2) to be connected to an external connector and pins (1) which are to be soldered to a printed circuit card (28). The connector pins (2) are straight and secured flat against the edge of the substrates (4, 5, 6) carrying the active circuits (10); the spacing between two substrates thus corresponds to that between two rows of pins. The pins (1) to be soldered extend perpendicularly to the pins (2) of the connector and are also secured to the substrates.

7 Claims, 2 Drawing Sheets

DATA BUS CONNECTOR

The invention relates to a connector, comprising a first series of pins which are arranged in a plurality of rows and which are to be connected to an electrical printed circuit, and also comprising a second series of pins which are also arranged in a plurality of rows and which are to be connected to an external connector. A connector of this kind is well known from the catalogues of various suppliers.

One of the applications of such a connector is, for example the realization of electrical connections between a complex data processing board and a bus which is connected to the connector, for example a "VME" bus. In order to establish such a connection it is necessary to utilize interface circuits which are formed mainly by integrated circuits which serve, for example for the shaping, delay or temporary storage of data, for routing the data in accordance with their transmission direction, namely, providing the connection between a bidirectional data line and two unidirectional lines, and for adapting the levels or the fan-out of the circuits on the board. These interface circuits are accommodated on the printed circuit board connector beside the connector which is customarily a "right-angle edge connector". Such interface circuits must be provided on each board and occupy a substantial surface area thereof. In high-speed electronics the connections should be as short as possible; this condition is difficult to satisfy in view of the surface area occupied by all interface circuits together. The required surface area could be reduced by mounting integrated circuits in the form of chips on the board. However, this technique is not economically feasible for at least two reasons: on the one hand, the mounting efficiency for chips is low and the risk of rejection of a complete, often very expensive board must be avoided, and on the other hand the format of the boards usually precludes mounting by means of chip mounting machines.

It is an object of the invention to provide a connector which enables a saving as regards the space occupied by the interface circuits and hence a higher yield and an improved electrical performance of the boards as a result of the reduced length of the connections.

To achieve this, the connector in accordance with the invention is characterized in that it comprises a plurality of substrates which are arranged at a plurality of mutually substantially parallel levels, one side of each substrate being aligned with respect to the corresponding side of the other substrates, each substrate being provided along said side with a row of one of the two series of connector pins, active components being mounted on the substrates and being connected between the two series of pins.

In order to obtain the desired density, the substrates carry surface-mounted components, notably semiconductor chips which are mounted directly on the substrates.

As a result of the subdivision into small substrates, the use of chips becomes economical, thus resulting in smaller dimensions, shorter connections and hence a higher electrical performance. This also enables the use of special substrates for given circuits, for example for circuits which benefit from a substrate having a low dielectric constant: the substrate material may differ from one substrate to another, if desired. Such a subdivision, however, customarily has the drawback that the number of connections (soldered connections, connectors) between the substrates increases, thus also increasing the connection lengths and reducing the improvement and at the same time increasing the cost price and the vulnerability.

As a result of the special arrangements in accordance with the invention, the pins intended for connection to the printed circuit of the board are used to connect the board to the substrates and the pins intended for connection to an external connector are used to connect the same substrates to the environment in the most direct manner; thus, for the connection of the substrates use is made of the pins which are present anyway and the overall number of additional pins specifically used for connecting the substrates is reduced.

The pins which are arranged on the substrates along said aligned side are preferably straight and secured flat against each substrate along the edge thereof.

In a special embodiment in which the pins of one series extend substantially perpendicularly with respect to those of the other series, which means that the connector is of the "right-angle edge" type, at least one side of the substrates other than said aligned side is retracted with respect to the corresponding side of one of the neighbouring substrates, thus forming a passage for a connection secured perpendicularly to the edge of the neighbouring substrate.

This feature enables direct electrical access to all levels of the interface circuits, all pins being arranged along the outer edges of each substrate so that the substrates remain mechanically independent and hence easy to assemble in the connector.

The interface circuits have a substantial total power consumption which, however, can be dissipated as a result of the fact that the substrates are contained in a housing which is provided with cooling means and which is filled with a heat-conductive material.

In order to achieve an even higher performance as a result of the shortening of the interconnections, the connector preferably comprises direct electrical connections between two neighbouring substrates.

This increases the structural complexity of the connector and could make mounting more difficult; however, this will not be the case when said connections are realized by means of a plurality of conductors, each of which is secured to only one of two neighbouring substrates and presses against a conductor element of the other substrate or when said electrical connections are realized by means of elastic conductors which are supported by an insulating strip and which are pressed between two neighbouring substrates.

The invention will be described in detail hereinafter with reference to the accompanying drawings. Therein:

Figure 1:
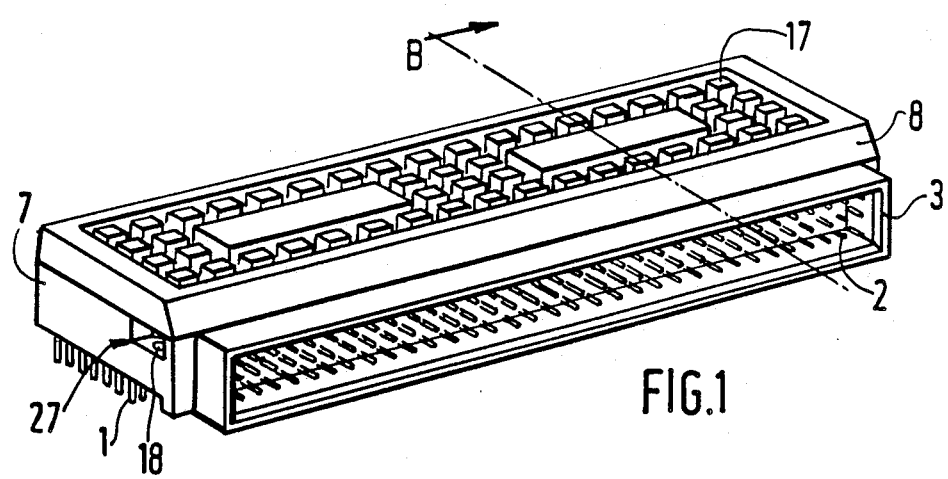
FIG. 1 is a perspective view of a connector in accordance with the invention.
Figure 2:
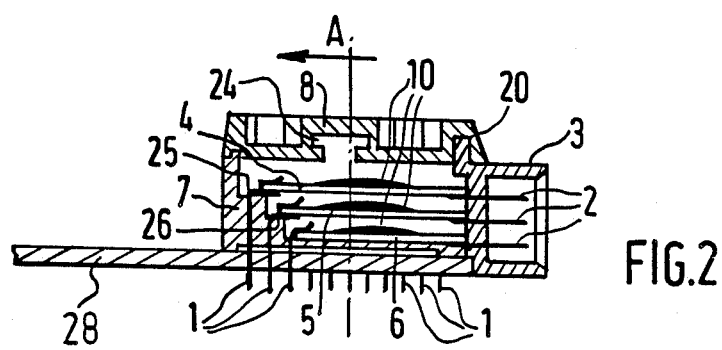
FIG. 2 is a sectional view, taken along the line B, of the connector shown in FIG. 1.

In comparison with a passive right-angle edge connector, the connector shown in FIG. 1 has substantially the same height but a slightly larger depth. It comprises a first series of pins 1 which are vertically arranged on its lower face and which are intended for connection to an electrical printed circuit, and also comprises a second series of horizontal pins 2 which are arranged on the front face of the connector and which are intended for connection to an external connector (not shown). FIG. 2 is a cross-sectional view, taken along line B, and shows an assembly of active circuits 10 which are mounted inside the connector and which are connected between the first series of pins 1 and the second series of pins 2; they are formed on three substrates 4, 5, 6 which are arranged at three mutually substantially parallel levels. One of the sides of each of the three substrates is aligned with respect to the corresponding side of the other two substrates, i.e. all substrates occupy the position shown in the Figure, pressing at the right against the same virtual vertical plane which extends perpendicularly to the planes of the substrates, each substrate carrying one of the rows of the second series of pins 2 along said side. These pins are straight and are soldered flat against the right-hand edge (in the Figure) of each of the substrates 4, 5, 6. The vertical distance between the planes of the substrates thus equals the standardized distance between the rows of pins 2.

Figure 3:
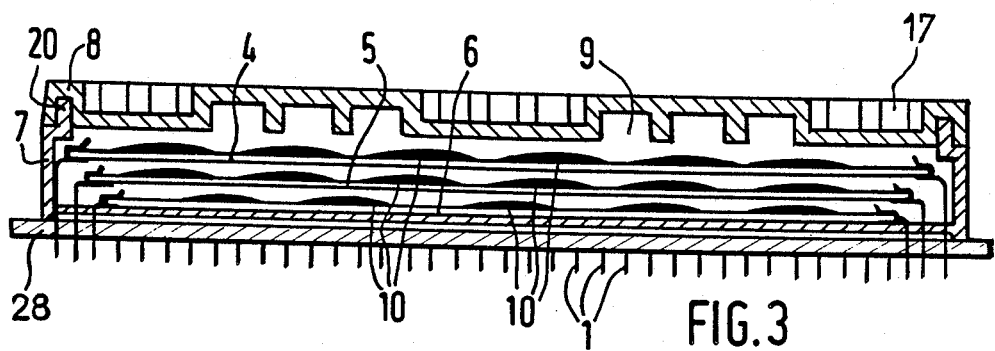
FIG. 3 is a sectional view, taken along the line A, of the connector shown in FIG. 2.
Figure 4:
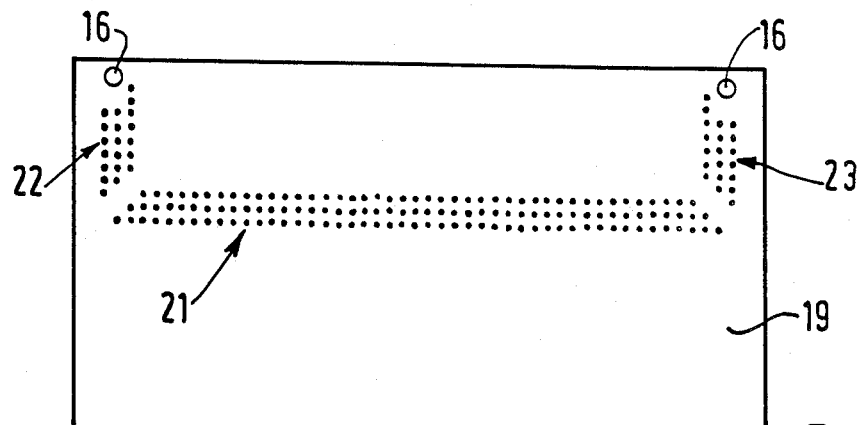
FIG. 4 shows the arrangement of the pins of one of the series.

The pins 1 of the first series of this connector extend substantially perpendicularly to those of the second series and the width of the substrate 5 is smaller than that of the substrate 4 so as to allow passage of the connections 25, connected to the substrate 4 at the left (in the Figure), at the left-hand side of the substrate 5. Similarly, the width of the substrate 6 is smaller than that of the substrate 5 in order to form a passage for the connections 26 which are connected to the latter substrate. These vertical connections to horizontal substrates are of a conventional type which is known from the "hybrid circuit" technique. The substrates are made, for example from epoxy glass and their thickness is chosen in conformity with the standard connections 25, 26. FIG. 3 is a sectional view taken perpendicularly to that shown in FIG. 2 and shows that the substrates have a width which decreases from the top downwards also in the other direction, so that connections can be made at both their extremities. In the present example, the second series comprises 96 pins which are arranged in three rows of 32 pins, the pins being spaced 2.54 mm apart. The arrangement of the pins of the first series is illustrated in FIG. 4 which shows the end of a board which is intended to receive a connector in accordance with the invention. These pins are arranged in three sets 21, 22, 23, each of which comprises three rows of pins with a pitch of 1.905 mm. The arrangement shown comprises 175 pins.

Each substrate carries several integrated circuits in the form of chips. All circuits are glued to the substrates and are wired preferably on an automatic machine. Before assembly of the substrates they are protected by deposition of a drop of varnish. The protected circuits are denoted by the reference numeral 10 in FIGS. 2 and 3. The complexity of the circuits required for connecting such a large number of connection pins to the multitude of outputs of the integrated circuits in general necessitates the use of multi-layer circuits for the substrates, or at least double-faced types with plated-through holes. Instead of epoxy substrates, use can also be made of ceramic substrates of the type used in the "hybrid" technology with different levels of surface metallizations.

Using the arrangement shown, the connection of a point situated on, for example the substrate 4 to a point situated on the substrate 5 necessitates a passage via a connection 25, a metallization on the basic printed circuit 28, and a connection 26. This condition again increases the complexity of the circuits; therefore, it may be advantageous to use direct electrical connections between two neighbouring substrates. Such connections can be realized by means of rigid vertical pins whose ends are soldered to both circuits to be connected. However, such connections make the overall circuit difficult to mount and almost impossible to remove.

Figure 5:
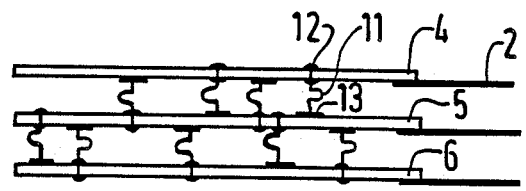
FIG. 5 shows one method of realizing direct connections between neighbouring substrates.
Figure 6:
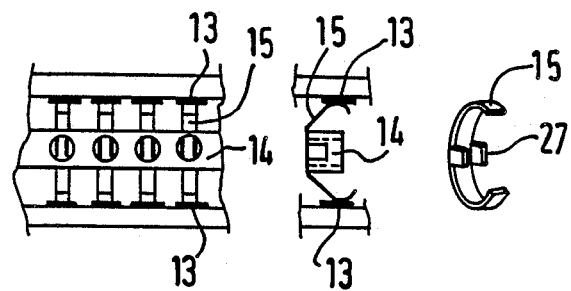
FIG. 6 shows another method of realizing direct connections between neighbouring substrates.

The connections shown in FIG. 5 eliminate this drawback. They are formed by a third series of pins 11 which are positioned between two neighbouring substrates 4, 5 or 5, 6 and which are secured to only one of the two substrates to be connected. The connection denoted by the reference numeral 11 is soldered to 12 on the substrate 4 and makes contact by pressing against the pad 13 of the circuit on substrate 5. It is to be understood that the inverse is also possible and that FIG. 5 also comprises pins which are secured to the substrate 5 and which make contact by pressing against a pad of the circuit on substrate 4, and similarly for the connections between the substrates 5 and 6. The connections shown comprise a U-shaped portion which serves to provide a spring-effect. However, any means suitable for making contact by pressure can be used. FIG. 6 shows another method of realizing these vertical connections; they are now realized by means of elastic laminations 15 which extend essentially perpendicularly to the substrates and which are supported by an insulating strip 14. These laminations contact metallizations 13 on the substrates. When these laminations are formed, projections 27 are folded so as to enable fixation in holes in the strip 14. The strips are mechanically secured, using any known means, to a housing which accommodates all substrates.

A housing consists of several portions 7, 8, 3 of a plastic material. The portion 7 (FIGS. 2 and 3) forms a box which is open at one of its larger lateral sides as well as at its top. This box preferably comprises projections in the form of a set of steps (as shown in FIG. 2 at the level of the connections 25, 26) supporting the substrates having dimensions which decrease in the direction from the top downwards. The large lateral side is closed by the portion 3 which carries and encloses the pins of the second series; the top is closed by a cast metal cover 8. The cover 8 is profiled in order to increase the surface area for cooling purposes. In order to ensure suitable thermal contact between the substrates and their integrated circuits and the cover 8, the housing is preferably filled with a plastic material 9 having a suitable thermal conductivity. Preferably, the housing is filled, after the cover has been placed on the box 7, by injecting the material through the hole 27 (FIG. 1), the assembly being positioned upside down. The box 7 and the portion 3 comprise tongues 20 which cooperate with grooves in the cover 8 in order to ensure better tightness during filling. The cover 8 comprises recesses 24 for anchoring to the plastic filling material. The latter is, for example a material which is commercially known as SILITRO, C 10 resin, a two-component cold-polymerizing resin. The portions 7 and 3 of the housing can be made of a material which is commerically known as RYNITE FR530 and which is available from DU-PONT DE NEMOURS. The metal of the cover 8 is, for example aluminium.

The assembly can be secured on the printed circuit 28 by means of the first series of pins 1; securing is preferably complemented by means of screws which pass through the holes 16 (FIG. 4) of the basic printed circuit 28 and which are screwed into the holes 18 (FIG. 1) of the connector.

It will be apparent that the construction of the connector in accordance with the invention is not restricted to the described embodiment and that notably the number of pins, the number of rows of pins of each series and hence the number of substrates, may be different. When direct connections are used, the pins of the first series need not necessarily be arranged at the periphery.

We claim:

1. A connector comprising a first series of pin means which are arranged in a plurality of rows and which are for connection to an electrical printed circuit, and also comprising a second series of pin means which are also arranged in a plurality of rows and which are for connection to an external connector, wherein the pin means of one series extend substantially perpendicularly with respect to those of the other series, and wherein a plurality of substrates are arranged at a plurality of mutually substantially parallel horizontal levels, one side edge of each substrate being vertically aligned with respect to the corresponding side edges of the other substrates, each substrate being provided along said side edge with a row of the second series of pin means, active components being mounted on the substrates and being connected between the two series of pin means, at least one side edge of one of the substrates other than said aligned side edge horizontally overlapping and extending past the corresponding side edge of one of the neighboring substrates, whereby a passage is provided for a connection of a row of the first series of pin means secured perpendicularly to said at least one side edge of said at least one substrate which row of the first series extends downwardly past the side edge of the one neighboring substrate for connection to the printed circuit.

2. A connector as claimed in claim 1, characterized in that the pins which are arranged on the substrates along said aligned side are straight and secured flat against each substrate along a surface thereof.

3. A connector as claimed in claim 2, characterized in that the substrates are accommodated in a housing which is provided with cooling means and which is filled with a heat-conductive material.

4. A connector as claimed in claim 2, characterized in that the substrates carry surface-mounted components, notably chip-type semiconductors which are mounted directly on the substrates.

5. A connector as claimed in claim 2, characterized in that it comprises direct electrical connections between two neighbouring substrates.

6. A connector as claimed in claim 1, characterized in that said connections are realized by means of a plurality of conductors, each of which is secured to only one of two neighbouring substrates and is pressed onto a conductor element of the other substrate.

7. A connector as claimed in claim 1, characterized in that said connections are realized by means of elastic conductors which are supported by an insulating strip and which are pressed between two neighbouring substrates.

* * * * *